United States Patent
Dickey et al.

(10) Patent No.: US 8,202,366 B2
(45) Date of Patent: Jun. 19, 2012

(54) ATOMIC LAYER DEPOSITION SYSTEM UTILIZING MULTIPLE PRECURSOR ZONES FOR COATING FLEXIBLE SUBSTRATES

(75) Inventors: Eric R. Dickey, Portland, OR (US); William A. Barrow, Beaverton, OR (US)

(73) Assignee: Lotus Applied Technology, LLC, Hillsboro, OR (US)

( * ) Notice: Subject to any disclaimer, the term of this patent is extended or adjusted under 35 U.S.C. 154(b) by 0 days.

(21) Appl. No.: 12/755,239

(22) Filed: Apr. 6, 2010

(65) Prior Publication Data

US 2010/0189900 A1  Jul. 29, 2010

Related U.S. Application Data

(63) Continuation-in-part of application No. 11/691,421, filed on Mar. 26, 2007, now Pat. No. 8,137,464.

(60) Provisional application No. 60/743,786, filed on Mar. 26, 2006.

(51) Int. Cl.
    *C23C 16/00* (2006.01)
(52) U.S. Cl. ........................................ 118/718; 118/719
(58) Field of Classification Search .................. 118/718, 118/719; 204/298.24
    See application file for complete search history.

(56) References Cited

U.S. PATENT DOCUMENTS

| | | |
|---|---|---|
| 2,384,500 A | 9/1945 | Stoll |
| 2,458,394 A | 1/1949 | Luboshez |
| 3,314,393 A | 4/1967 | Haneta |
| 3,379,803 A | 4/1968 | Tittmann et al. |
| 3,650,042 A | 3/1972 | Boerger et al. |
| 3,964,434 A | 6/1976 | Adler et al. |
| 4,058,430 A | 11/1977 | Suntola et al. |
| 4,220,117 A * | 9/1980 | Shinohara ............... 118/718 |
| 4,454,835 A | 6/1984 | Walsh et al. |
| 4,692,233 A | 9/1987 | Casey |
| 4,728,406 A | 3/1988 | Banerjee et al. |
| 4,803,947 A | 2/1989 | Ueki et al. |

(Continued)

FOREIGN PATENT DOCUMENTS

EP  0574020 A1  12/1993

(Continued)

OTHER PUBLICATIONS

A.P. Ghosh, L. J. Gerenser, C. M. Jarman and J. E. Fornalik, "Thin-film encapsulation of organic light-emitting devices," *Applied Physics Letters* 86 223503, May 2005.

(Continued)

*Primary Examiner* — Karla Moore
(74) *Attorney, Agent, or Firm* — Stoel Rives LLP

(57) ABSTRACT

Systems and methods for atomic layer deposition (ALD) on a flexible substrate involve guiding the substrate back and forth between spaced-apart first and second precursor zones and through a third precursor zone interposed between the first and second precursor zones, so that the substrate transits through each of the precursor zones multiple times. Systems may include a series of turning guides spaced apart along the first and second precursor zones for supporting the substrate along an undulating transport path. As the substrate traverses back and forth between the first and second precursor zones and through the third precursor zone, it passes through a first series of flow-restricting passageways of a first isolation region interposed between the first and third precursor zones and a second series of flow-restricting passageways of a second isolation region interposed between the second and third precursor zones.

18 Claims, 4 Drawing Sheets

U.S. PATENT DOCUMENTS

| | | | |
|---|---|---|---|
| 5,102,279 | A | 4/1992 | Ezaki et al. |
| 5,266,116 | A | 11/1993 | Fujioka et al. |
| 5,411,592 | A | 5/1995 | Ovshinsky et al. |
| 5,462,602 | A * | 10/1995 | Misiano et al. ............... 118/718 |
| 5,629,054 | A | 5/1997 | Kanai |
| 5,736,431 | A | 4/1998 | Shinohara et al. |
| 5,817,550 | A | 10/1998 | Carey et al. |
| 6,174,377 | B1 | 1/2001 | Doering et al. |
| 6,620,288 | B2 | 9/2003 | Shinohara et al. |
| 6,758,911 | B2 | 7/2004 | Campbell et al. |
| 6,821,563 | B2 | 11/2004 | Yudovsky |
| 6,888,172 | B2 | 5/2005 | Ghosh |
| 7,070,658 | B2 * | 7/2006 | Guido et al. .................. 118/718 |
| 7,074,719 | B2 | 7/2006 | Kim et al. |
| 2002/0043216 | A1 | 4/2002 | Hwang et al. |
| 2002/0170496 | A1 | 11/2002 | Ha et al. |
| 2003/0131793 | A1 | 7/2003 | Endo et al. |
| 2004/0261703 | A1 | 12/2004 | Kobrin et al. |
| 2005/0016453 | A1 | 1/2005 | Seidel et al. |
| 2005/0172897 | A1 | 8/2005 | Jansen |
| 2005/0249875 | A1 | 11/2005 | Sasaki et al. |
| 2007/0224348 | A1 * | 9/2007 | Dickey et al. ................. 118/718 |
| 2007/0281089 | A1 | 12/2007 | Heller et al. |
| 2008/0092814 | A1 | 4/2008 | Yan et al. |

FOREIGN PATENT DOCUMENTS

| | | |
|---|---|---|
| EP | 1795625 A1 | 6/2007 |
| JP | 1985-030124 A | 2/1985 |
| JP | 2005-078818 | 3/1993 |
| JP | 2006-124784 A | 5/2006 |
| KR | 10-2004-0035083 A | 4/2004 |
| WO | WO 01/82390 | 11/2001 |
| WO | WO 2002/071506 | 9/2002 |
| WO | WO2006/088463 A1 | 8/2006 |
| WO | WO2006/093168 A1 | 9/2006 |
| WO | WO2007/126582 A2 | 11/2007 |
| WO | WO2007/126585 A2 | 11/2007 |

OTHER PUBLICATIONS

M.D. Groner, S.M. George, R.S. Mclean and P.F. Carcia, "Gas Diffusion Barriers on Polymers Using $Al_2O_3$ Atomic Layer Deposition," *48th Annual Technical Conference Proceedings of the Society of Vacuum Coaters*, pp. 169-172, 2005.

M.D. Groner, S.M. George, R.S. McLean and P.F. Carcia, "Gas diffusion barriers on polymers using $Al_2O_3$ atomic layer deposition," *Applied Physics Letters*, 88, 051907, Jan. 2006.

E. Langereis, S.B.S. Heil, M. Creatore, M.C.M. Van De Sanden and W.M.M. Kessels, "Plasma-Assisted Atomic Layer Deposition of $Al_2O_3$ on Polymers," *49th Annual Technical Conference Proceedings of the Society of Vacuum Coaters*, pp. 151-154, 2006.

P.F. Carcia, R.S. McLean, M.H. Reilly, M.D. Groner and S.M. George, "Ca test of $Al_2O_3$ gas diffusion barriers grown by atomic layer deposition on polymers," *Applied Physics Letters*, 89, 031915, Jul. 2006.

G.L. Graff, R.E Williford and P.E Burrows, "Mechanisms of vapor permeation through multilayer barrier films: Lag time versus equilibrium permeation," *Journal of Applied Physics*, 96(4), pp. 1840-1849, Aug. 2004.

Y. Numata, T. Oya, M. Kuwahara and K. Ito, "Water Vapor Permeation Studies of Metal Oxide/Polymer Coated Plastic Films," *48th Annual Technical Conference Proceedings of the Society of Vacuum Coaters*, pp. 660-662, 2005.

T. Hachisuka, S. Yoshida and C. Okawara, "Study of $SiO_x$ Structure for Development of Ultra Gas Barrier Films," *50th Annual Technical Conference Proceedings of the Society of Vacuum Coaters*, pp. 712-714, 2007.

M. Creatore, V.I.T.A. Lohmann, M.A. Blauw and M.C.M. Van De Sanden, "Flexible Organic Electronics: The Role of Plasma Deposition in Multi-Layer Permeation Barrier Technology," *49th Annual Technical Conference Proceedings of the Society of Vacuum Coaters*, pp. 143-146, 2006.

A.W. Smith, N. Copeland, D. Gerrerd and D. Nicholas, "PECVD of $SiO_x$ Barrier Films," *45th Annual Technical Conference Proceedings of the Society of Vacuum Coaters*, pp. 525-529, 2002.

A. Skinner, "Clear barrier films-Process, Performance and Opportunities," Proceedings of the Fall Conference of the Association of Industrial Metallizers, Coaters and Laminators (AIMCAL), Jun. 2006.

M. George, P. Morse, and J. Madocks, "High Barrier Transparent Coatings on Web by New Plasma Enhanced Chemical Vapor Deposition Process," *50th Annual Technical Conference Proceedings of the Society of Vacuum Coaters*, pp. 715-718, 2007.

B.M. Henry, H.E. Assender, A.G. Erlat, C.R.M. Grovenor and G.A. D. Briggs, "Gas Barrier Properties of Transparent Metal Oxide Coatings on PET Film," *47th Annual Technical Conference Proceedings of the Society of Vacuum Coaters*, pp. 609-614, 2004.

H. Suttle, A.J. Topping and H.E Assender, "Vacuum Deposition of High Performance Gas Barrier Materials," Proceedings of the Fall Conference of the Association of Industrial Metallizers, Coaters and Laminators (AIMCAL), 2008.

N. Schiller, S. Straach, S. Gunther, A. Quiceno, A. Contreras, R. Ludwig and G. Hoffmann, "Innovative Clear Barrier Technology for the Packaging Industry," Proceedings of the Fall Conference of the Association of Industrial Metallizers, Coaters and Laminators (AIMCAL), 2008.

H. Suttle, A.J. Topping, V.M. Burlakov and H.E Assender, "Sputtered Ultra-High Gas Barrier $AlO_x$ Layers," *51st Annual Technical Conference Proceedings of the Society of Vacuum Coaters*, pp. 795-798, 2008.

S. Louch, S. Edge, K. Luxmore, M. Hodgson, R. Adam and S. Spruce, "The Performance and Limitations of Simple Reactively Sputtered Barrier Coatings on Polymer Webs," Proceedings of the Fall Conference of the Association of Industrial Metallizers, Coaters and Laminators (AIMCAL), pp. 1-7, 2007.

A.G. Erlat, B.M. Henry, C.R.M. Grovenor, G.A.D. Briggs and Y. Tsukahara, "Factors Affecting Water Vapor Permeation Through $PET/AlO_xN_y$ Films," *45th Annual Technical Conference Proceedings of the Society of Vacuum Coaters*, pp. 503-508, 2002.

M.D. Groner, F.H. Fabreguette, J.W. Elam and S.M. George, "Low-Temperature $Al_2O_3$ Atomic Layer Deposition," *Chem. Mater.*, 16, 639-645, Jan. 2004.

S.-H. K. Park, J. Oh, C.-S. Hwang, J.-I. Lee, Y. S. Yang and H. Y. Chu, "Ultrathin Film Encapsulation of and OLED by ALD," *Electrochemical and Solid State Letters*, 8 (2)1121-1123, Jan. 2005.

Erlat et al., Ultra-high Barrier Coatings on Polymer Substrates for Flexible Optoelectronics: Water Vapor Transport and Measurement Systems, 47th Ann. Tech. Conf. Proc., pp. 654-659, Society of Vacuum Coaters, Apr. 2004, 6 pages.

\* cited by examiner

ATOMIC LAYER DEPOSITION SYSTEM UTILIZING MULTIPLE PRECURSOR ZONES FOR COATING FLEXIBLE SUBSTRATES

RELATED APPLICATIONS

This is a continuation-in-part of and claims benefit under 35 USC §120 from U.S. patent application Ser. No. 11/691,421 filed Mar. 26, 2007, now U.S. Pat. No. 8,137,464 which claims the benefit under 35 USC §119(e) from U.S. Provisional Application No. 60/743,786, filed Mar. 26, 2006, both of which are incorporated herein by reference.

BACKGROUND

The field of this disclosure relates to thin film deposition systems and methods for coating flexible substrates.

Atomic layer deposition ("ALD"), formerly known as atomic layer epitaxy ("ALE"), is a thin film deposition process that is known for use in manufacturing electroluminescent (EL) display panels, in semiconductor integrated circuit manufacturing, and for other purposes. See U.S. Pat. No. 4,058,430 of Suntola et al., and U.S. Patent Application Publication Nos. US 2004/0208994 A1 of Härkönen et al., US 2004/0124131 A1 of Aitchison et al., and US 2005/0011555 A1 of Maula et al., the specifications of which are all incorporated herein by reference. ALD offers several benefits over other thin film deposition methods, such as physical vapor deposition ("PVD") (e.g., evaporation or sputtering) and chemical vapor deposition ("CVD"), as described in Atomic Layer Epitaxy (T. Suntola and M. Simpson, eds., Blackie and Son Ltd., Glasgow, 1990), incorporated herein by reference.

In contrast to CVD, in which the flows of precursors are static (i.e., flow rates are steady during processing) and the substrate is exposed to multiple precursors simultaneously present in the reaction chamber, the precursor flows in ALD processing are dynamic and sequential, so that the substrate is exposed to only one precursor at a time. Successful ALD growth has conventionally required the sequential introduction of two or more different precursor vapors into a reaction space around a substrate. ALD is usually performed at elevated temperatures and low pressures. For example, the reaction space may be heated to between 200° C. and 600° C. and operated at a pressure of between 0.1 mbar and 50 mbar. In a typical ALD reactor, the reaction space is bounded by a reaction chamber sized to accommodate one or more substrates. One or more precursor material delivery systems (also known as "precursor sources") are typically provided for feeding precursor materials into the reaction chamber.

After the substrates are loaded into the reaction chamber and heated to a desired processing temperature, a first precursor vapor is directed over the substrates. Some of the precursor vapor chemisorbs or adsorbs on the surface of the substrates to make a monolayer film. In pure ALD, the molecules of precursor vapor will not attach to other like molecules and the process is therefore self-limiting. Next, the reaction space is purged to remove excess of the first vapor and any volatile reaction products. Purging is typically accomplished by flushing the reaction space with an inert purge gas that is non-reactive with the first precursor. After purging, a second precursor vapor is introduced. Molecules of the second precursor vapor chemisorb or otherwise react with the chemisorbed or adsorbed first precursor molecules to form a thin film product of the first and second precursors. To complete the ALD cycle, the reaction space is again purged with an inert purge gas to remove any excess of the second vapor as well as any volatile reaction products. The steps of first precursor pulse, purge, second precursor pulse, and purge are typically repeated hundreds or thousands of times until the desired thickness of the film is achieved.

The required temperatures, pressures, and reaction chamber conditions have conventionally limited the ALD technique to deposition on substrates of relatively small size. For example, known uses of ALD include EL display panels and semiconductor wafers.

SUMMARY

In accordance with one embodiment, a system for depositing a thin film on a flexible substrate includes first, second, and third precursor zones in which the third precursor zone is interposed between the first and second precursor zones. A first isolation region is interposed between the first and third precursor zones, and a second isolation region is interposed between the second and third precursor zones. When in use, reactive first, second, and third precursor gases are introduced into the respective first, second, and third precursor zones, and an inert gas is introduced into the first and second isolation regions. A first series of flow-restricting passageways from the first isolation region to the first and third precursor zones are spaced apart along the first and third precursor zones, and a second series of flow-restricting passageways from the second isolation region to the second and third precursor zones are spaced apart along the second and third precursor zones. The passageways may include elongated tunnels and/or flexible wipers to restrict the flow of gases between the isolation regions and the precursor zones. When in use, a flexible substrate is threaded through the passageways so that it traverses back and forth between the first and second precursor zones multiple times and each time through the first and second isolation regions and the third precursor zone. A substrate transport mechanism of the system includes a plurality of first turning guides, such as rollers, spaced apart along the first precursor zone and a plurality of second turning guides spaced apart along the second precursor zone. At least some of the first turning guides are adapted to support the substrate during a change in a direction of travel of the substrate toward the second and third precursor zones, and at least some of the second turning guides are adapted to support the substrate during a change in a direction of travel of the substrate toward the first and third precursor zones. The substrate transport mechanism may include a payout spool and a take-up spool for roll-to-roll processing of the substrate.

A method of thin film deposition, according to one embodiment, includes introducing first and second precursor gases into respective first and second precursor zones, introducing a third precursor gas into a third precursor zone interposed between the first and second precursor zones and spaced apart from the first and second precursor zones to define respective first and second isolation regions, introducing an inert gas into the first isolation region, and then guiding a flexible substrate back and forth between the first and second precursor zones and through the third precursor zone so that the substrate transits through the first, second, and third precursor zones multiple times, the substrate traveling through a first series of flow-restricting passageways of the first isolation region and a second series of flow-restricting passageways of the second isolation region. The method further includes generating pressure differentials between the first isolation region and the first precursor zone and between the first isolation region and the third precursor zone, the pressure differentials being sufficient to inhibit migration of the first and third precursor gases out of the respective first and third precursor zones and mixing of the first and third precursor gases within one of the zones, thereby essentially preventing reactions within the zones between nonadsorbed amounts of the first and third precursor gases. The pressure differential may be achieved, for example, by differential injection of gases into the various zones or by differential pumping or throttling of exhaust gases from the various zones. In some embodiments, an inert gas is injected into some or all of the passageways. As the substrate transits through the first precursor zone, a monolayer of the first precursor gas is adsorbed to the surface of the substrate, and on a subsequent transit of the substrate through the third precursor zone, the third precursor gas reacts with the adsorbed first precursor at the surface of the substrate. Many layers of material may be deposited by guiding the substrate along a serpentine path that traverses between the first and second precursor zones and through the third precursor zone many times.

In some embodiments of the method and system, the substrate is transported through four or more precursor zones, all isolated from one another by isolation regions. One or more of the turning guides, precursors, precursor zones, isolation fluid, or isolation regions may be heated.

In some embodiments, the isolation regions and precursor zones may be operated at approximately atmospheric pressures, while in others the pressure may range from relatively low vacuum pressures (e.g. 1 millitorr) to positive pressures of 500 to 1500 Torr (approx. 1-2 atmospheres).

In some embodiments of the method and system, the flexible substrate may be advanced continuously along a serpentine path in a first direction to complete a first pass, and subsequently rewound along the serpentine path in a second direction opposite the first direction to complete a second pass.

Embodiments of the method may also include the steps of switching precursors during or between passes, introducing dopants into one or more precursor zones, and/or introducing a radical into one or more of the precursor zones. A length or duration of some of the transits through the precursor zones may be adjusted, in some embodiments, by movably mounted turning guides or zone dividers.

Systems and methods for trapping exhaust precursor gases for disposal, recycling, or reclaim are also disclosed.

DETAILED DESCRIPTION OF PREFERRED EMBODIMENTS

In accordance with embodiments described herein, a flexible substrate, such as a plastic or metallic web or filament, for example, is threaded between adjacent zones each having a different precursor chemical or isolation fluid present therein. As the substrate is advanced, each segment of the substrate is preferably resident in the precursor zones long enough to accomplish the requisite adsorption and reaction of precursor chemicals on the substrate surface. An isolation zone interposed between the precursor zones prevents mixing of the different precursor gases. The substrate is moved through the zones to achieve a thin film coating consistent with the coatings deposited by conventional ALD processes. In addition to enabling the deposition of a highly conformal thin film coating on web materials and on other flexible elongate substrates, systems and methods according to the embodiments described herein may avoid the need to deliver into a common reaction chamber a sequence of precursor and purge gas pulses in alternating succession, as is done in a conventional traveling wave-type ALD reactor.

Among other possible benefits, certain systems and methods disclosed herein may facilitate the deposition of barrier layers and transparent conductors on flexible substrates, such as on plastic substrates for organic light emitting diode (OLED) displays, and the deposition of conformal coatings on very large substrates. Many additional advantages and uses of the systems and methods will become apparent from the following detailed description, which proceeds with reference to the accompanying drawings.

Figure 1:
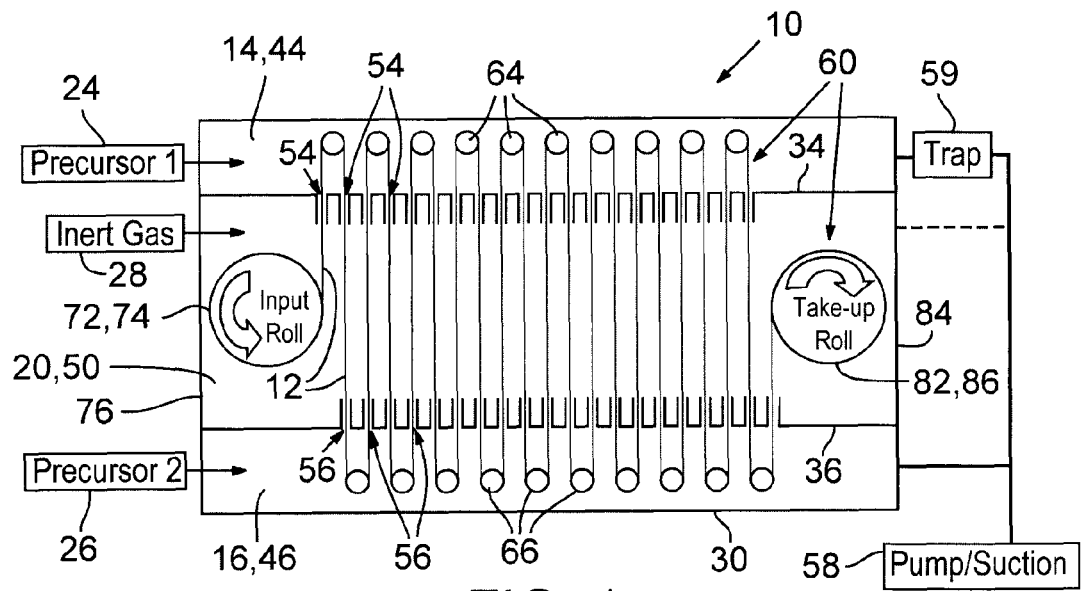
FIG. 1 is a schematic cross-sectional view illustrating a system and method for ALD on a flexible substrate, in accordance with a first embodiment.

FIG. 1 illustrates a schematic cross-section view of a system 10 according to a first embodiment for the deposition of a thin-film coating onto a flexible substrate 12 (shown in profile in FIG. 1), such as a web of plastic film or metal foil, for example. With reference to FIG. 1, system 10 includes first and second precursor zones 14 and 16, respectively, separated by an intermediate isolation zone 20 in which an inert fluid is present. The inert fluid may comprise an inert liquid, but more preferably consists essentially of an inert gas, such as nitrogen ($N_2$). When in use, reactive first and second precursor gases (Precursor 1 and Precursor 2) are introduced into the respective first and second precursor zones 14, 16 from first and second precursor delivery systems 24, 26. Precursor delivery systems 24, 26 may include precursor source containers (not shown) located outside or within precursor zones 14, 16. Additionally or alternatively, precursor delivery systems 24, 26 may include piping, pumps, valves, tanks, and other associated equipment for supplying precursor gases into precursor zones 14, 16. An inert gas delivery system 28 is similarly included for injecting inert gas into isolation zone 20.

In the embodiment shown, precursor zones 14, 16 and isolation zone 20 are defined and bordered by an outer reaction chamber housing or vessel 30, divided by first and second dividers 34, 36 into three sub-chambers, namely, a first precursor chamber 44, a second precursor chamber 46 and an inert gas chamber 50. Vessel 30 may comprise a pressure vessel or vacuum vessel substantially isolating the process space from the external environment. In other embodiments, the vessel 30 may have entrance and exit passageways for interfacing with other process modules or equipment, as described below with reference to FIG. 4. A series of first passageways 54 through first divider 34 are spaced apart along a general direction of travel of substrate 12, and a corresponding series of second passageways 56 are provided through second divider 36. The passageways 54, 56 are arranged and configured for substrate 12 to be threaded therethrough back and forth between first and second precursor zones 14, 16 multiple times, and each time through isolation zone 20. For a web substrate, passageways 54, 56 preferably comprise slits having a width (exaggerated in FIG. 1) that is slightly greater than the thickness of substrate 12 and a length (not shown) extending into the plane of FIG. 1 (i.e., normal to the page) and that is slightly greater than a width of the substrate. Isolation zone 20 is, thus, preferably separated (albeit imperfectly) from the first precursor zone 14 by first divider 34 and from second precursor zone 16 by second divider 36.

Figure 2:
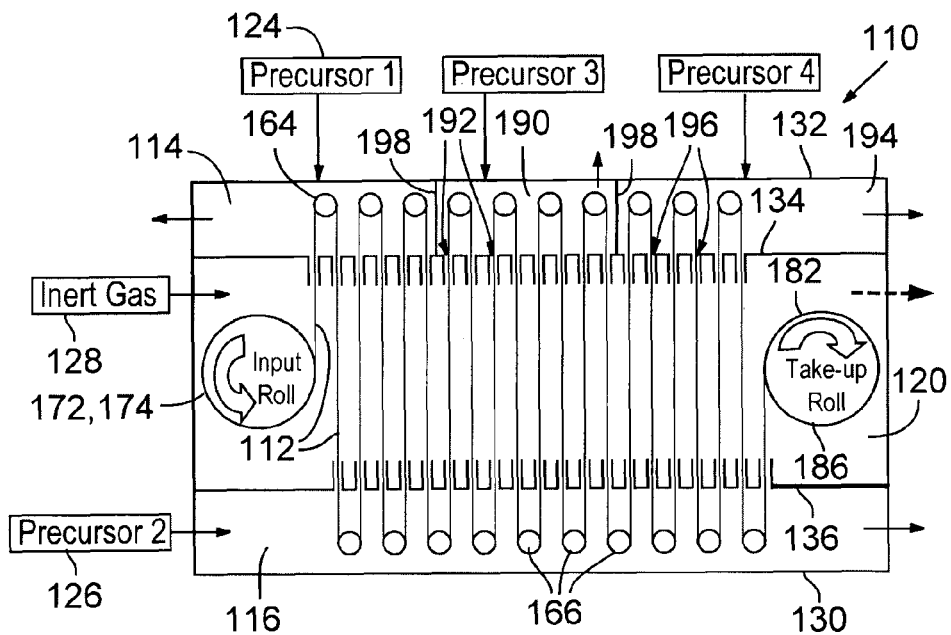
FIG. 2 is a schematic cross-sectional view illustrating a system and method utilizing ALD for coating layers of different materials onto a flexible substrate, in accordance with a second embodiment.
Figure 4:
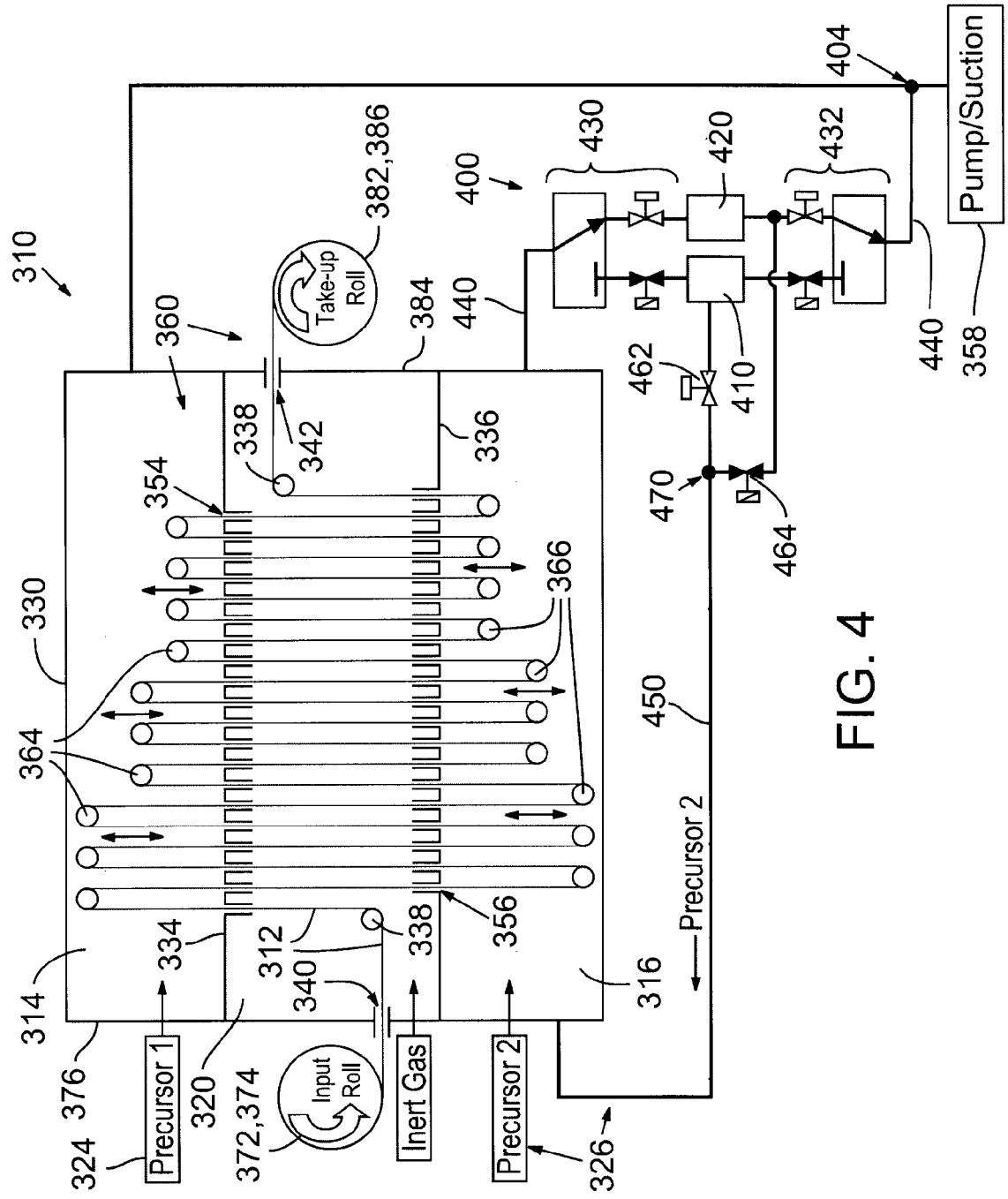
FIG. 4 is a schematic cross-sectional view illustrating a system and method for ALD on a flexible substrate according to a fifth embodiment, including a precursor recovery and recycling system.

To substantially prevent non-ALD reactions caused by mixing of non-adsorbed quantities of the first and second precursor gases in one of the chambers 44, 46, 50, it is necessary for the system 10 to inhibit the migration of Precursor 1 from first precursor zone 14 into isolation zone 20 and the migration of Precursor 2 from second precursor zone 16 into isolation zone 20. Passageways 54, 56 are preferably configured to restrict the flow of gases between the zones 14, 16, 20, to avoid or limit diffusion of precursor gases into a common zone. Passageways 54, 56 may include slits sized only slightly thicker and wider than the thickness and width of the substrate passing through them, leaving only a very small amount of headroom and margins to allow substrate 12 to pass therethrough without scraping against the sides of the passageways. For example, headroom and margins may range between microns and millimeters in certain embodiments. The passageways 54, 56 may also include elongate tunnels through which the substrate 12 passes, as depicted in FIGS. 1, 2, and 4. Such slits and tunnels are sometimes referred to as slit valves, although no actual moving valve gate is utilized. In some embodiments, the passageways 54, 56 include a wiper for further restricting flow. In one such embodiment, the substrate is threaded through opposing leaves of resilient material, such as a synthetic rubber, which wipe against opposing surfaces of the substrate.

In an alternate embodiment (not shown), the inert gas chamber 50 of isolation zone 20 and dividers 34, 36 are eliminated, so that isolation zone 20 essentially consists of a series of long narrow passageways extending completely between precursor zones 14, 16. In such an embodiment, no common inert gas chamber 50 connects the passageways, so inert gas is injected directly into the passageways medially of the first and second precursor zones 14, 16 to help prevent precursor migration and mixing. Isolation zone 20 of this embodiment would include a manifold, or a number of manifolds, for routing inert gas lines to nozzles along the sides of the passageways. The manifold or manifolds would be formed in the material of the reaction chamber bordering the passageways, and may be connected to an inert gas delivery system along the sides of the system, rather than at an end of the system as shown in FIG. 1.

To help isolate the first precursor gas from the second precursor gas, pressure differentials are preferably established between the isolation zone 20 and the first precursor zone 14 and between the isolation zone 20 and the second precursor zone 16. In one embodiment, the pressure differentials may be generated by injecting inert gas into isolation zone 20 at a pressure greater than the operating pressure of the precursor zones 14, 16, and then passively exhausting gases from the precursor zones 14, 16. In another embodiment, the exhaust from precursor zones 14, 16 could be controlled relative to a passive exhaust from isolation zone 20 or by throttling an exhaust flow from isolation zone 20. Pressure differentials may also be generated by pumping from precursor zones via pump 58 or another source of suction. Optionally, pump 58 may be coupled to all zones, with flow from the various zones being controlled to maintain the pressure differential. The migration of precursors from the precursor zones 14, 16 into the isolation zone 20 may also be prevented or limited by controlling both the relative flow rates of gases into the zones and pumping speeds from the zones, through the use of flow control valves or other flow control devices. A control system (not shown) responsive to pressure sensors in the various zones may also be utilized to control gas injection and exhaust flow rates to help maintain a desired pressure differential.

In one example, isolation zone 20 operates at a pressure of approximately 5 millitorr (i.e., the inert gas injection pressure may be 5 millitorr), and pressure differentials of approximately 0.1 millitorr are maintained between isolation zone 20 and each of the precursor zones 14, 16, so that an operating pressure of approximately 4.9 millitorr is maintained in precursor zones 14, 16 by way of suction applied to precursor zones 14, 16 by pump 58. Lower and significantly higher pressure differentials may also be used in some embodiments. The necessary pressure differential will be affected by the geometry of passageways 54, 56 (including height, width, and tunnel length, if applicable), the headroom and margins around substrate 12 within passageways 54, 56, the transport speed of substrate 12, the surface roughness of substrate 12 and passageways 54, 56, and the location at which inert gas is injected, such as direct injection into passageways 54, 56 or generally into inert gas chamber 50. Other factors, such as operating temperature, pressure, precursor species, and substrate type, may also affect the amount of pressure differential necessary to inhibit or prevent migration of precursor gases through passageways.

In some ALD processes, precursor gases having a very low vapor pressure are utilized. To facilitate pumping and diffusion control, inert gas may be mixed with such precursor gases, either before or after introduction of the precursor gases into the system 10, to control the pressure within precursor zones 14, 16.

In some embodiments, it may be desirable to equalize the pressures, or to deliberately mismatch the pressures in two or more precursor zones to optimize growth conditions, or improve utilization of precursor materials. It may also be desirable to pump two or more of the zones separately, and introduce inert gas into the precursor zones separately to further reduce zone migration; for instance, a cross-flow condition may be used to flow precursor in a direction orthogonal to the passageways 54, 56 (between first and second ends 72, 84). Inert gas may be introduced locally within or near passageways 54, 56, to inhibit gases from either adjacent zone from crossing through passageways 54, 56. If further isolation is necessary, multiple differentially-pumped and purged zones may be used in series, with flow-restricting passageways or wiper valve isolation between zones and exhaust paths from each of the zones.

As described above, the precursor zones 14, 16 may be pumped to achieve an isolating pressure differential between the isolation zone and the precursor zones. In one configuration (not shown), separate pumps could be used for each of the zones 14, 16, 20, preventing mixing of precursor gases in the pump stack and the attendant growth of material or reaction byproducts in any of the pumping lines, thereby preventing powder and residue from accumulating and clogging the pump stack. Another way to inhibit undesirable material deposits in the pump stack is to trap exhaust precursors using a precursor trap 59, such as a simple inline liquid nitrogen cooled trap, for example model TLR4XI150QF sold by Kurt J. Lesker Company (www.lesker.com). Similar precursor traps may be placed in each of the precursor exhaust lines upstream of their junction before the pump 58. By using inert gases and precursor materials having different vapor pressures at a given temperature, it may be possible to trap and reclaim up to approximately 100% of exhaust precursor gases, while passing inert gases to the pump stack. And because different precursors are not mixed in the zones, the precursor purity is maintained, enabling up to 100% utilization of precursor materials. Once filled, traps 59 may be turned into precursor sources by replacing the liquid nitrogen with a heated liquid or by activating heating elements outside the trap, then reversing the pumping direction or closing an isolation valve (not shown) between pump 58 and trap 59. The particular operating temperature of trap/source would depend on the precursor being trapped and its vapor pressure. A liquid nitrogen trap, for example, may operate at lower than 100° Kelvin. Additional trap/source configurations are described below with reference to FIG. 4.

Figure 3:
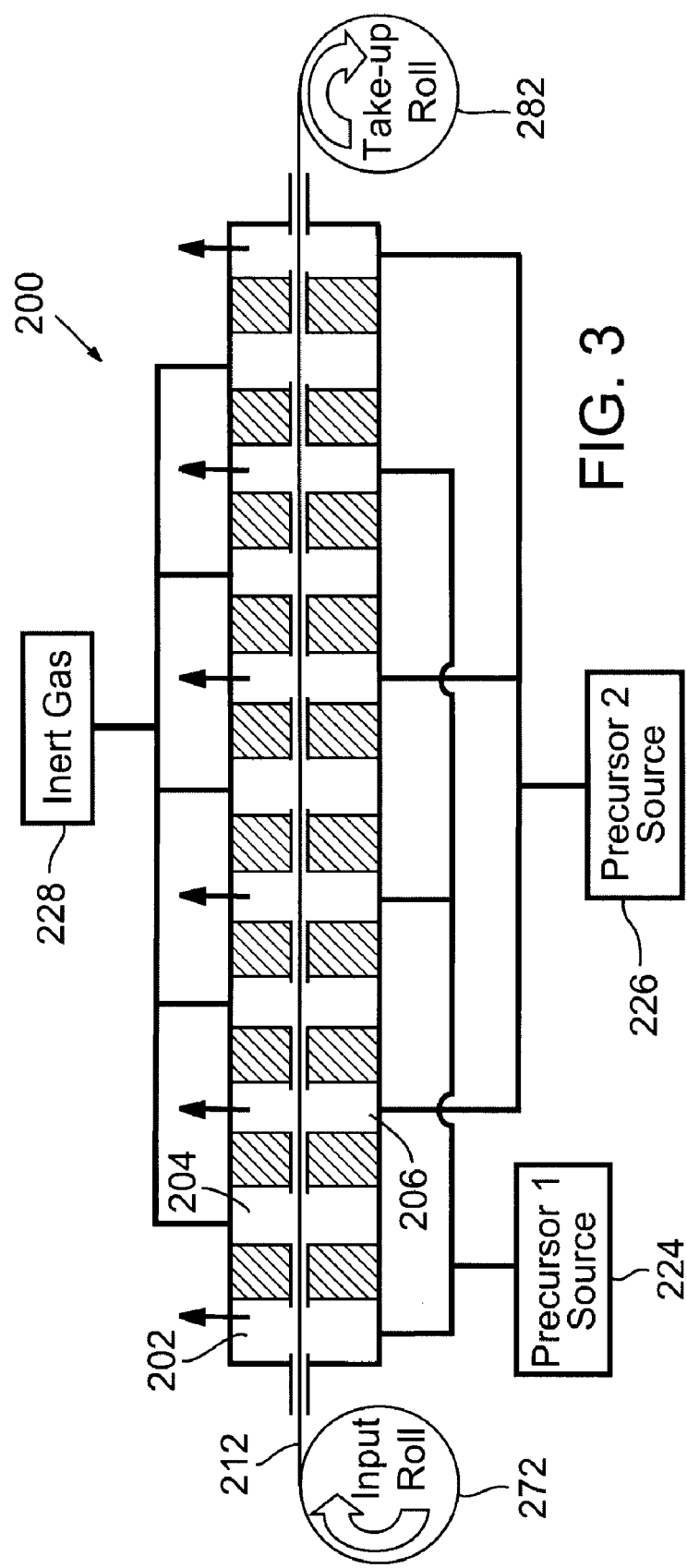
FIG. 3 is a schematic cross-sectional view illustrating a system and method for ALD in which a substrate is moved through a linear multi-stage ALD reactor, in accordance with a fourth embodiment.

A substrate transport mechanism 60 of system 10 includes multiple turning guides for guiding substrate 12, including a set of first turning guides 64 spaced apart along first precursor zone 14 and a second set of turning guides 66 spaced apart along second precursor zone 16. Turning guides 64, 66 cooperate to define an undulating transport path of substrate 12 as it advances through system 10. The substrate transport mechanism 60 may include a payout spool 72 for paying out substrate 12 from a first coil (input roll 74) for receipt at a first end 76 of isolation zone 20, vessel 30, or one of the precursor zones 14, 16. The substrate transport mechanism 60 may further include a take-up spool 82 for receiving the coated substrate 12 from a second end 84 of isolation zone 20, vessel 30, or one of the precursor zones 14, 16 opposite first end 76, and coiling the substrate 12 into a take-up roll 86 or second coil. Payout spool 72 and/or take-up spool 82 may be located within vessel 30, such as within isolation zone 20, as depicted in FIGS. 1-2. Alternatively, payout and take-up spools 72, 82 may be located outside of vessel 30 (i.e., outside of isolation zone 20 and first and second precursor zones 14, 16), as depicted in FIGS. 3 and 4. Input and take-up rolls 74, 86 will change diameter during operation of system 10, and will therefore require tension control and/or drive control systems of the kind well known in the art of web handling and coil handling systems. Additional turning guides may be provided for determining the transport path of substrate 12 through, and in some embodiments, into, the vessel 30. For example, additional turning guides (not shown) may be required to compensate for changes in the diameter of the input and take-up rolls 74, 86 during operation of system 10.

Turning guides 64, 66 may comprise rotating guide supports, such as rollers, pulleys, sprockets, or pinch rollers, as well as non-rotating guide supports, such as guide bars, rails, or channels. Suitable rotating guide supports include both idlers, e.g. idler rollers, and driven rotating supports—the latter being driven by a drive mechanism (not shown) that may include means for synchronizing the rotating guide supports with each other and with payout spool 72 and/or take-up spool 82. Non-rotating guide supports may preferably include a bearing surface made of or coated with a low-friction material, such as PTFE (TEFLON™). In one embodiment, turning guides 64, 66 may comprise fluid bearings (e.g. gas bearings) that support substrate 12 on a dynamic cushion of fluid, such as precursor gas and/or inert gas injected through small perforations in a bearing race of the fluid bearing.

Depending on the configuration of substrate transport mechanism 60 and passageways 54, 56, the transport path of substrate 12 may have a serpentine profile, a sawtooth profile, or any other suitable shape for transporting substrate between first and second precursor zones 14, 16. Substrate 12 preferably threads through passageways 54, 56 and traverses isolation zone 20 in a direction normal to the plane of dividers 32, 34, such that opposing pairs of first and second passageways 54, 56 are aligned with a traversal axis normal to dividers 32, 34. However, other arrangements and transport path configurations may also be utilized.

In the embodiment shown, each of the first turning guides 64 is positioned within the first precursor zone 14 and supports substrate 12 as it turns 180° about the turning guide 64 toward the second precursor zone 16. Similarly, each of the second turning guides 66 is positioned within the second precursor zone 16 and supports substrate 12 as it turns 180° about the turning guide 66 toward the first precursor zone 14. In an alternative embodiment (not shown), only some of the turning guides 64, 66 may support substrate 12 as it turns toward the opposite precursor zone. For example, two turning guides may be used for a single 180° turn, each supporting the substrate through 90° of the turn. In other embodiments, substrate 12 may turn through somewhat more or less than 180° between traversals of isolation zone 20. A turn of greater than 180° could be implemented to fit more turning guides, and therefore more deposition cycles, within a system of a given overall length. A transit path of substrate 12 through precursor zones 14, 16 may be curved and/or straight. In one embodiment (not shown), some or all of the first and second turning guides may be located outboard of the respective first and second precursor zones such that the substrate follows a straight transit path completely across the respective precursor zone nearest the turning guide and through passageways in dividers bordering the inboard and outboard sides of the respective precursor zone.

The system 10 illustrated in FIG. 1 includes ten first turning guides 64 and ten second turning guides 66, providing ten full cycles of ALD growth. In one example, the system of FIG. 1 may be used to deposit a coating of aluminum oxide ($Al_2O_3$) approximately ten angstroms (10 Å) thick using trimethylaluminum (TMA) as Precursor 1 and water as Precursor 2. Additional ALD cycles may be added to system 10 by adding pairs of turning guides. For example, a 100-cycle system may have 200 turning guides—100 first turning guides 64 and 100 second turning guides 66. By using small-diameter guide rollers or other turning guides, such a system could be as small as one meter long from the input roll 74 to the take-up roll 86, approximately 50 cm high, and only slightly wider than the width of substrate 12. Systems capable of 500, 1000, 5000, or more ALD cycles in a single pass are also envisioned. Similar expansions are possible in the systems of FIGS. 2 and 4, described below.

To increase film thickness beyond what is deposited in a single pass through system 10 by the number of ALD cycles defined by transport mechanism 60, the substrate 10 may be passed through the system multiple times, either by moving the take-up roll 86 from the second end 84 to the first end 76 after a pass, by reversing the transport direction of the substrate 12 to send it back through the system, or by using a closed-loop substrate that circulates back to the input side 76 for achieving multiple passes through the system without movement or handling of the bulk roll. In between sequential passes, one or more of the precursors within the precursor zones 14, 16 may be changed to provide a multi-layer coating stack of two or more thin film materials.

FIG. 2 illustrates a system 110 and method according to a second embodiment for depositing layers of different materials on a flexible substrate 112 in a single pass through system 110. In the embodiment of FIG. 2, multiple separate precursor zones are located in sequence along the length of the reaction chamber. In FIG. 2, 100-series reference numerals with the last two digits similar to the reference numerals of FIG. 1 designate similar components. For example, system 110 includes a first precursor zone 114 supplied by a first precursor delivery system 124, a second precursor zone 116 supplied by a second precursor delivery system 126, and an isolation zone 120 supplied by an inert gas delivery system 128. System 110 of FIG. 2 further includes a third precursor zone 190 into which a third precursor gas (Precursor 3) different from the first and second precursor gases (Precursor 1 and Precursor 2) is introduced when the system is in use. Third precursor zone 190 is separated from isolation zone 120 by a third divider and positioned opposite second precursor zone 116. In the embodiment shown, the third divider is a middle section of upper divider 134, which includes a series of third passageways 192 therethrough, spaced apart along third precursor zone 190. Similarly, a fourth precursor zone 194 for receiving a fourth precursor gas (Precursor 4) is positioned opposite second precursor zone 116 and separated from isolation zone 120 by an end section of upper divider 134, through which a series of spaced-apart fourth passageways 196 are provided. Precursor 4 is preferably different from Precursor 1, Precursor 2, and Precursor 3, but may alternatively be the same as Precursor 1 to achieve deposition of alternating layers of thin film materials. Third precursor zone 190 is isolated from first and fourth precursor zones 114, 194 by a pair of partition walls 198 at opposite ends of third precursor zone 190, each extending between upper divider 134 and an outer reaction chamber wall 132 of vessel 30.

In the embodiment of FIG. 2, more than two precursor zones are utilized to fabricate multiple layers of distinct materials—for example a first ten serpentine paths may traverse between first precursor zone 114 and second precursor zone 116, respectively, and the next ten serpentine paths may traverse between third precursor zone 190 and second precursor zone 116, finally, etc., resulting in multi-layer film stacks.

In one example, the system 110 illustrated in FIG. 2 may utilize TMA as Precursor 1, water as Precursor 2, $TiCl_4$ as Precursor 3, and TMA as Precursor 4 to coat 3 cycles of $Al_2O_3$ (approximately 3 Å), followed by 4 cycles of titania ($TiO_2$) (approximately 2 Å), followed by another 3 cycles of $Al_2O_3$.

In another example, a thin film of aluminum-doped zinc oxide (ZnO) may be formed utilizing a system similar to the one shown in FIG. 2. Aluminum-doped ZnO is an optically transmissive conductive oxide film that may be useful as a substitute for more expensive indium-tin-oxide (ITO) electrodes commonly used in electronics and solar cells. In this example, diethylzinc (DEZn) or dimethylzinc (DMZn) are used as Precursor 1 and Precursor 4, and each of the first and fourth precursor zones 114, 194 includes between 50 and 100 turning guides (i.e., the substrate transits between 50 and 100 times in each of the first and fourth precursor zones). An oxidant, such as water, or more preferably ozone, is used as Precursor 2, and TMA is used as Precursor 3. The third precursor zone 190 may include only a very small number of turning guides (and transits)—for example two—to deposit only a doping amount of Aluminum oxide within the bulk ZnO. The substrate may then be transported through the system multiple times, in multiple passes, to achieve the desired mechanical, electrical, and optical properties.

Figure 5:
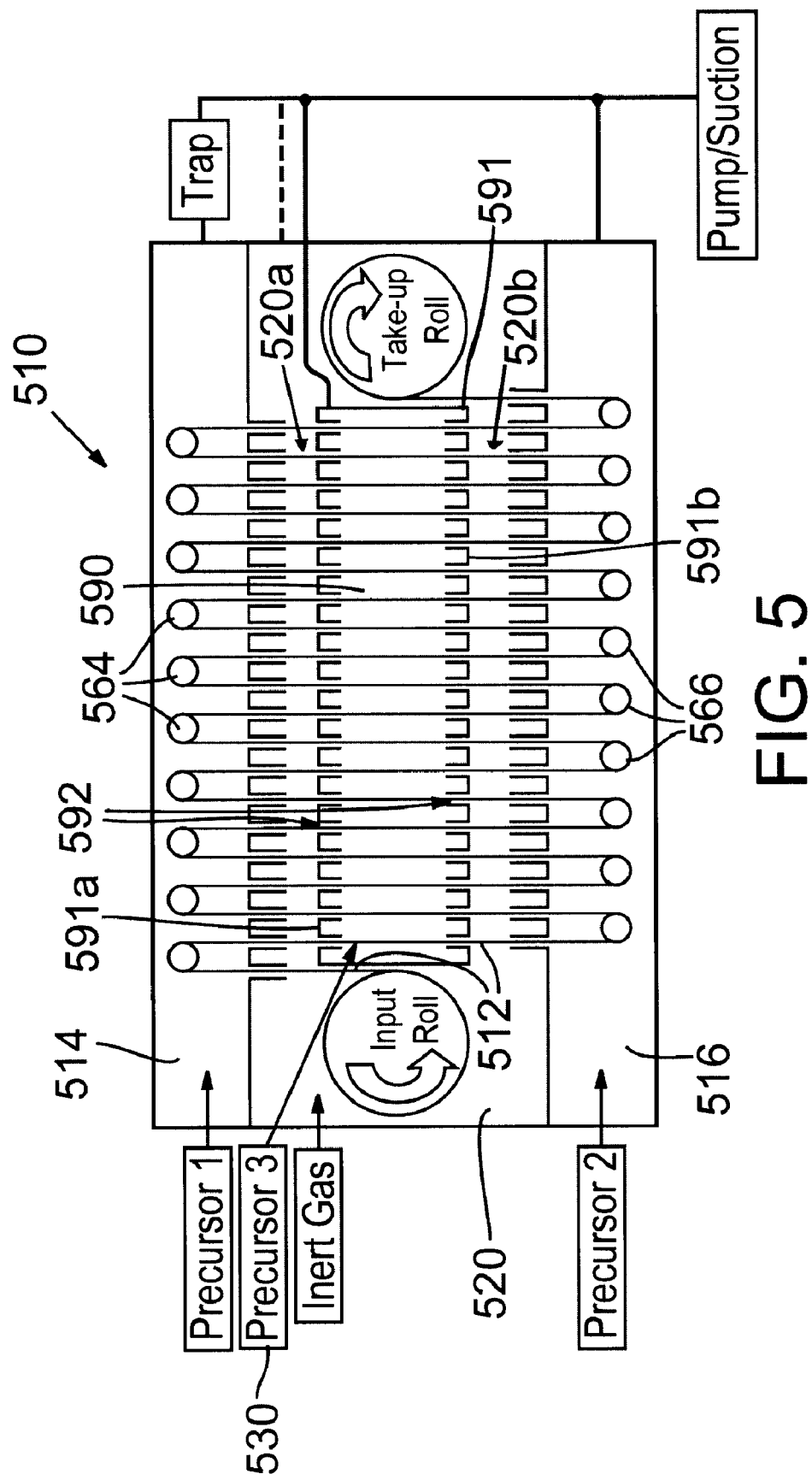
FIG. 5 is a schematic cross-sectional view illustrating a system and method utilizing ALD on a flexible substrate, in accordance with a third embodiment.

In a third embodiment illustrated in FIG. 5, a system 510 includes a third precursor zone 590 positioned between first and second precursor zones 514, 516 so that an isolation zone 520 straddles third precursor zone 590 to thereby create first and second isolation regions 520*a*, 520*b* on opposing top and bottom sides of third precursor zone 590. First and second isolation regions 520*a* and 520*b* need not be part of a unitary isolation zone as shown in FIG. 5; rather isolation regions 520*a* and 520*b* may correspond to separate isolation zones. Third precursor zone 590 is separated from isolation zone 520 by a third divider 591 including spaced-apart top and bottom divider portions 591*a* and 591*b*, each defining a series of flow-restricting passageways 592 through which substrate 512 is threaded when in operation. A precursor delivery system 530 is coupled to third precursor zone 590 for supplying Precursor 3 to third precursor zone 590, wherein Precursor 3 is different from one or both of Precursor 1 and Precursor 2. In the stacked configuration of the third embodiment, a substrate 512 traverses across third precursor zone 590 as it is transported between first and second precursor zones 514, 516. More specifically, as substrate 512 traverses from first precursor zone 514 to second precursor zone 516, substrate 512 is transported from first precursor zone 514 to first isolation region 520*a*, from first isolation region 520*a* to third precursor zone 590, from third precursor zone 590 to second isolation region 520*b*, and from second isolation region 520*b* to second precursor zone 516. Turning guides 566 direct substrate 512 back in an opposite direction so that substrate 512 is transported from second precursor zone 516 back to second isolation region 520*b*, from second isolation region 520*b* to third precursor zone 590, from third precursor zone 590 to first isolation region 520*a*, and from first isolation region 520*a* to first precursor zone 514. In the third embodiment, Precursor 1 and Precursor 2 may be the same type of gas and Precursor 3 may be a different type of gas from Precursor 1 and Precursor 2. In one example, Precursor 1 and Precursor 2 are water and Precursor 3 is TMA. Alternatively, Precursor 1, Precursor 2, and Precursor 3 may be three different gases. Having multiple precursor zones stacked in accordance with the third embodiment may effectively reduce the number of turning guides 564, 566 required to produce in a single pass a film of a desired thickness, compared to that of the first and second embodiments. Other variations on the configuration of systems 110 and 510 are also contemplated, the variety of configurations preferably having their various precursor zones isolated from each other by one or more isolation zones, to prevent precursor gases from reacting in any of the zones, except at the surface of substrate 112, 512.

In a fourth embodiment shown in FIG. 3, a system 200 may be configured without rollers, yet achieve ALD-type deposition on a long thin substrate 212, such as a web, by passing the substrate 212 along a linear transport path between alternating zones 202, 204, 206, etc., of precursor 1, inert gas, precursor 2, inert gas, precursor 1, inert gas, etc. In FIG. 3, exhaust or pumping lines from precursor zones 202, 206, etc. are omitted for simplicity. While system 200 would likely be much longer than those of FIGS. 1 and 2 for a given layer count, the system 200 of FIG. 3 could be made very thin, for example if configured as a straight-line system such as ones used for architectural glass coating systems. Accordingly, system 200 could be used to coat both flexible substrates and rigid substrates. It could also reduce issues arising, in the systems 10 and 110 of FIGS. 1 and 2, from contact between substrate 12 and the turn guides 64, 66 of substrate transport mechanism 60. In one embodiment, precursor 1 is TMA and precursor 2 is water vapor, and one pass of the substrate 212 through the system completes three ALD cycles to deposit approximately three angstroms (3 Å) of aluminum oxide ($Al_2O_3$). One variation on the configuration of FIG. 3 would be to have a chamber with as few zones as four, e.g., precursor 1, inert gas isolation, precursor 2, and inert gas isolation, to provide one full ALD cycle. A closed-loop substrate of flexible material (not shown) could be circulated through such a system, and the number of trips or circulations of the loop substrate through the chamber would determine the resulting coating thickness.

Some systems and methods of the kind described herein may not necessarily require highly specific geometry or mechanical configuration. For instance, in addition to the configurations illustrated in FIGS. 1-3 and 5, the substrate could be wound through a path that looks like a "zig-zag" or a sine wave, or any path, as long as the substrate winds sequentially through regions that provide at least the following: (1) exposure to one precursor; (2) an isolation zone, wherein the substrate is not exposed to one of the primary precursors; (3) exposure at least a second precursor; and (4) a second isolation zone as in step (2), which may be a common zone as that used for step (2). The substrate does not necessarily have to pass over rollers—essentially any mechanical arrangement that allows the traversal or threading of the substrate through the sequential zones would work.

FIG. 4 illustrates a system 310 according to a fifth embodiment, wherein the last two digits of 300-series reference numerals designating precursor zones 314, 316, isolation zone 320, and components of substrate transport mechanism 360 correspond to similar 2-digit reference numerals identifying similar elements in the embodiment of FIG. 1. With reference to FIG. 4, system 310 includes input and take-up rolls 374, 386 located outside of the reaction chamber housing 330. Additional input/output turning guides 338 are provided within isolation zone 320. Substrate 312 is fed through one or more slits, wiper valves, or other flow-constricting entrance and/or exit passageways 340, 342. Positioning the input and take-up rolls 374, 386 outside of reaction chamber 330 may ease roll loading and unloading.

In an alternative embodiment (not shown), the input and take-up rolls 374, 386 may be placed in separate vacuum chambers or load-locks adjacent the first and second ends 376, 384 of reactor housing 330. Additional process modules may be provided between input roll 374 and reaction chamber 330 and/or between reaction chamber 330 and take-up roll 386 such that the thin film coating process would comprise just one module in a larger substrate processing system. For example, a preheating stage or other functionalization module may be provided between input roll 374 and reaction chamber 330. Examples of pre-treating or functionalizing steps useful with ALD coating system 310 include vacuum processing to speed up out-gassing of substrate 312 before coating; ultra-violet light treatment; ozone treatment, e.g., for making normally-hydrophobic plastic films hydrophilic to enhance or enable ALD processing; exposure to a plasma or other source of radicals; and cleaning steps. Other process modules, such as lithography and other patterning steps, non-ALD deposition such as sputtering, and other surface finishing and coating steps, may also be utilized.

System 310 includes adjustable turning guides 364, 366 that are movable toward and away from dividers 334, 336 and isolation zone 320 to change a substrate dwell time within the precursor zones 314, 316. The location of turning guides 364, 366 may be adjusted independently or in groups, and may be controlled by a control system 310 to change dwell time as process needs change over time. In FIG. 4, three different groups of turning guides are shown in each precursor zone, each group having a different dwell time. Adjusting dwell time may facilitate nucleation for certain precursors, and may improve precursor penetration in porous surfaces. Similarly, dividers 334, 336 may be movable along the same direction as adjustable turning guides 364, 366 (i.e., up and down), to change the substrate dwell time in isolation zone 320.

System 310 further includes a precursor recycling subsystem 400 located upstream of a junction 404 of the pumping/exhaust lines from first and second precursor zones 314, 316. Subsystem 400 includes first and second traps 410, 420 flanked by a pair of three-way valves 430, 432, or their equivalent, to enable one of the traps 410, 420 to be selectively interposed in the pumping line 440 between the precursor zone 316 and pump 358. A first one of the valves 430 includes two outlets, one being connected to the inlet of first trap 410 and the other connected to the inlet of second trap 420. Similarly, second valve 432 includes two inlets; one connected to the outlet of first trap 410 and the other to the outlet of second trap 420. FIG. 4 shows the left-hand sides of valves 430, 432 being closed and the right-hand sides open, so that second trap 420 is interposed in the pumping line 440 and serving as a precursor trap. Meanwhile, first trap 410 is isolated from the pumping line 440, as indicated by blackened shut-off valves on the left-hand side of each three-way valve 430, 432. First trap 410 is operating in a regenerative mode, whereby the trap 410 is being heated to release previously trapped precursor material into a precursor supply/recycling line 450. Isolation valves 462, 464 are provided between supply outlets of respective traps 410, 420 and a downstream supply junction 470 of the supply outlets in supply/recycling line 450. The position of valves 430, 432, 462, and 464 may be reversed from what is shown in FIG. 4, so that first trap 410 functions as the inline precursor trap, and second trap 420 operates as a precursor source. In the embodiment shown, one half of subsystem 400 is always operating as a trap, and the other half as a supply component of precursor delivery system 326.

A second subsystem (not shown) may be provided in the first precursor zone exhaust line upstream of junction 404 for trapping and recycling first precursor in a similar manner.

Suitable traps 410, 420 for subsystem 400 may include simple inline liquid nitrogen traps or, more preferably, cryogenic "waterpumps" modified to pump a precursor, rather than water, at suitable pressures and temperatures. Suitable cryogenic waterpumps preferably include built-in heaters for regeneration capability. Example of cryogenic waterpumps include the Polycold® PFC water vapor cryopump and the CTI-Cryogenics® LowProfile Waterpump™, both sold by Brooks Automation (www.brooks.com). Cryogenic waterpumps are normally configured to pump in a low vacuum environment, but may be modified or adjusted to work in the operating pressure ranges of methods described herein. For some precursors the trap operating temperature may range from 100-150° Kelvin, while for others, it may range between 150° and 300° Kelvin. Higher trapping temperatures may enable certain metal halide precursor chemicals to be trapped, while allowing other materials, such as background water vapor, solvents, and inert gas, to pass, thereby improving the purity of trapped precursor.

The systems and methods described herein may exhibit little or no coating of moving machine parts, including the payout and take-up spools 72, 82, 172, 182, 272, 282, 372, 382 and turning guides 64, 66, 164, 166, 364, 366, 564, 566 since each of these parts is either resident in only one zone of the system, or entirely outside of the zones. Unlike conventional ALD systems, high-speed pulse valves are not required in the systems described herein and, in theory, maintenance requirements would be minimal.

Systems and methods consistent with the embodiments disclosed herein may operate over a relatively wide range of temperatures and pressures. Necessary operating temperatures and pressures will largely be determined by specific process chemistry. However, for example, operating pressures may range from relatively low vacuum environments of approximately 1 millitorr, to positive pressure environments of 500-1500 Torr (approximately 1 to 2 atmospheres). Pressures may be different in different precursor zones, to accommodate the use of precursors having different vapor pressure, molecular mobility, and reactivity characteristics, for example. In some embodiments, two or more precursor zones and the inert gas zone may be maintained at different temperatures to optimize film properties and/or throughput. Operating temperatures may also vary from below room temperature to well above room temperature, at operating temperatures typical of traveling wave ALD reactors.

Heated rollers or turning guides 64, 66, 164, 166, 364, 366, 564, 566 may be utilized in some embodiments, to heat the substrate and promote thin film growth via ALD. One or more of the precursor zones 14, 16, 114, 116, 314, 316, 514, 516, 590 and/or the isolation zone 20, 120, 320, 520 may also be heated. The passageways 54, 56, 154, 156, 354, 356, 592 may be heated by injecting a heated inert gas directly into the passageways.

In one embodiment, a plasma discharge or other source of radicals is included in one or more of the precursor zones, or in an adjacent chamber, to enable plasma- or radical-assisted ALD film growth.

The systems and methods described herein will normally result in deposition on both faces of the substrate. To achieve single-sided deposition, the substrate may be layered, folded, or masked for deposition, then peeled apart, unfolded, or the mask removed to result in a finished product. Other possible methods of single-sided deposition include deposition on a flattened tubular substrate followed by slitting lengthwise, or slitting of a solid substrate after double-sided deposition.

The systems and methods described herein are not limited to deposition on web substrates such as plastic films or metal foil. The same basic configuration could be used to coat wire, flexible tubing, woven materials, such as cloth, braided materials such as braided wire or rope, non-woven sheet materials such as paper, construction vapor barrier, etc.

The following are further examples of potential applications for the systems and methods disclosed herein:

1) On plastic or metal foil, as a gas or chemical barrier, as an electrical insulator, as an electrical conductor, or as a semiconductor. Specific applications include oxygen and moisture barriers for food or medical packaging, electrically insulating, conducting or semi-conducting films for large area solar cells, flexible displays, and flexible electronics.

2) Coatings on woven materials such as cloth to provide fire retardation, or functionalize the surface—to provide moisture or stain resistance, for example.

3) Gas or chemical barriers or tubing, such as plastic tubing used in chemical or medical applications.

4) Mechanical/physical property improvements in woven or pressed-sheet materials—for example, a film that could provide "filler" to join and bind the individual particles or fibers.

Throughout this specification, reference to "one embodiment," or "an embodiment," or "some embodiments" means that a particular described feature, structure, or characteristic is included in at least one embodiment. Thus appearances of the phrases "in one embodiment," "in an embodiment," "in some embodiments," and the like, in various places throughout this specification are not necessarily all referring to the same embodiment. Furthermore, the described features, structures, or characteristics may be combined in any suitable manner in one or more embodiments. In some cases, the invention may be practiced without one or more of the specific details or with other methods, components, materials, etc. In other instances, well-known structures, materials, or operations are not shown or not described in detail to avoid obscuring aspects of the embodiments.

It will be obvious to those having skill in the art that many changes may be made to the details of the above-described embodiments without departing from the underlying principles of the invention. The scope of the present invention should, therefore, be determined only by the following claims.

The invention claimed is:

1. A system for depositing a thin film on a flexible substrate, comprising:
   a first precursor zone into which a first precursor gas is introduced when the system is in use;
   a second precursor zone into which a second precursor gas is introduced when the system is in use;
   a third precursor zone into which a third precursor gas different from at least one of the first and second precursor gases is introduced when the system is in use, the third precursor zone interposed between the first and second precursor zones;
   a first isolation region interposed between the first and third precursor zones;
   a second isolation region interposed between the second and third precursor zones, an inert gas being introduced into the first and second isolation regions when the system is in use, the first isolation region including a first series of flow-restricting passageways opening into the first, and third precursor zones and the second isolation region including a second series of flow-restricting passageways opening into the second and third precursor zones, the first and second series of flow-restricting passageways arranged to provide a series of pathways along which a flexible substrate is threaded to traverse back and forth between the first precursor zone and the second precursor zone multiple times and each time through the first isolation region, the second isolation region, and the third precursor zone; and
   a substrate transport mechanism, including:
   a plurality of first turning guides spaced apart along the first precursor zone, at least some of the first turning guides adapted to support the substrate during a change in a direction of travel of the substrate toward the second and third precursor zones, and
   a plurality of second turning guides spaced apart along the second precursor zone, at least some of the second turning guides adapted to support the substrate during a change in a direction of travel of the substrate toward the first and third precursor zones.

2. The system of claim 1, in which the first and second precursor gases are of the same type.

3. The system of claim 1, in which the second precursor gas is different from the first precursor gas and the third precursor gas is different from the first and second precursor gases.

4. The system of claim 1, in which at least some of the passageways of the first or second isolation regions include a tunnel.

5. The system of claim 1, further comprising a first divider separating the first precursor zone from the first isolation region, a second divider separating the second precursor zone from the second isolation region, and a third divider separating the third precursor zone from the first isolation region, in which the first series of flow-restricting passageways includes a first group of passageways through the first divider and a second group of passageways through the third divider.

6. The system of claim 5, wherein the third divider separates the third precursor zone from the second isolation region, and the second series of flow-restricting passageways includes a first group of passageways through the second divider and a second group of passageways through the third divider.

7. The system of claim 1, in which each of the first and second turning guides includes a roller.

8. The system of claim 1, in which the first and second isolation regions are part of an isolation zone interposed between the first and second precursor zones, the isolation zone straddling the third precursor zone to form the first and second isolation regions on opposing sides of the third precursor zone.

9. The system of claim 8, in which the substrate transport mechanism further comprises:
- a payout spool for paying out the substrate from a coil for receipt at a first end of the isolation zone; and
- a take-up spool for coiling the substrate received from a second end of the isolation zone opposite the first end.

10. The system of claim 9, in which the payout and take-up spools are located within the isolation zone.

11. The system of claim 9, in which the payout and take-up spools are located outside the isolation zone, the first precursor zone, the second precursor zone, and the third precursor zone, and further comprising an inlet passageway at a first end of the isolation zone and an outlet passageway at a second end of the isolation zone opposite the first end.

12. The system of claim 9, in which the payout spool and the take-up spool each includes a reversible drive mechanism.

13. The system of claim 1, further comprising:
- a first precursor delivery system coupled to the first precursor zone for supplying the first precursor gas to the first precursor zone;
- a second precursor delivery system coupled to the second precursor zone for supplying the second precursor gas to the second precursor zone; and
- a third precursor delivery system coupled to the third precursor zone for supplying the third precursor gas to the third precursor zone.

14. The system of claim 1, further comprising an inert gas delivery system for injecting an inert gas into at least one of the first and second isolation regions.

15. The system of claim 1, in which at least some of the first turning guides are adjustably mounted within the first precursor zone for movement toward and away from the first isolation region, to thereby adjust a dwell time of the substrate in the first precursor zone.

16. The system of claim 1, further comprising a pump operably coupled to at least one of the first, second, and third precursor zones.

17. The system of claim 16, further comprising a precursor trap interposed between one of (a) the first, second, and third precursor zones, and (b) the pump.

18. The system of claim 1, further comprising a radicals generator for supplying a precursor radical to one of the first, second, and third precursor zones.

* * * * *

UNITED STATES PATENT AND TRADEMARK OFFICE
CERTIFICATE OF CORRECTION

| | |
|---|---|
| PATENT NO. | : 8,202,366 B2 |
| APPLICATION NO. | : 12/755239 |
| DATED | : June 19, 2012 |
| INVENTOR(S) | : Eric R. Dickey and William A. Barrow |

It is certified that error appears in the above-identified patent and that said Letters Patent is hereby corrected as shown below:

Column 1
Line 8, after "from", insert --co-pending--.

Column 11
Line 8, after "exposure", insert --to--.

Column 12
Line 34, replace "Example" with --Examples--.

Column 14
Line 23, after "first", delete the ",".

Signed and Sealed this
Eighth Day of January, 2013

David J. Kappos
*Director of the United States Patent and Trademark Office*